(12) United States Patent
Deutsch

(10) Patent No.: US 7,867,404 B2
(45) Date of Patent: Jan. 11, 2011

(54) METHOD FOR CONVERTING ELECTRICAL COMPONENTS

(76) Inventor: Joel Allen Deutsch, 5010 S. Rockport Rd., Bloomington, IN (US) 47401

( * ) Notice: Subject to any disclaimer, the term of this patent is extended or adjusted under 35 U.S.C. 154(b) by 1366 days.

(21) Appl. No.: 11/273,789

(22) Filed: Nov. 15, 2005

(65) Prior Publication Data

US 2007/0111525 A1    May 17, 2007

(51) Int. Cl.
*C23F 1/00* (2006.01)
(52) U.S. Cl. .................. 216/13; 216/14; 216/21; 216/52; 216/53; 216/83; 216/100; 216/108; 134/3
(58) Field of Classification Search ............ None
See application file for complete search history.

(56) References Cited

U.S. PATENT DOCUMENTS

| | | | | |
|---|---|---|---|---|
| 3,104,167 | A * | 9/1963 | Cotteta | 216/109 |
| 4,410,396 | A | 10/1983 | Somers et al. | |
| 4,964,920 | A * | 10/1990 | Jackson et al. | 134/3 |
| 5,643,472 | A | 7/1997 | Engelsberg et al. | |
| 5,805,422 | A * | 9/1998 | Otake et al. | 361/749 |
| 6,177,726 | B1 * | 1/2001 | Manteghi | 257/725 |
| 6,271,048 | B1 * | 8/2001 | Reilich et al. | 438/14 |
| 6,332,988 | B1 * | 12/2001 | Berger et al. | 216/100 |
| 6,657,707 | B1 * | 12/2003 | Morken et al. | 356/36 |
| 6,940,008 | B2 | 9/2005 | Shiotsuka et al. | |
| 7,461,771 | B2 * | 12/2008 | Leon | 228/180.22 |
| 2002/0185414 | A1 | 12/2002 | Morii et al. | |
| 2004/0111854 | A1 | 6/2004 | Kamimura et al. | |
| 2004/0181923 | A1 | 9/2004 | Dills | |
| 2004/0235513 | A1 | 11/2004 | O'Connell | |
| 2004/0243264 | A1 | 12/2004 | Metzger et al. | |

FOREIGN PATENT DOCUMENTS

| JP | 9-51158 | 2/1997 |
|---|---|---|
| JP | 09051158 A | 2/1997 |

OTHER PUBLICATIONS

Varsal—Products Chemicals—Applications Plating Chemicals, Jun. 22, 2004, pp. 1-3, http://www.varsal.com/plating_chemicals.html.
Varsal, Products Chemicals—Applications Plating Chemicals, Feb. 14, 2005, pp. 1-3, http://www.varsal.com/plating_chemicals.html.
PCT International Search Report dated Sep. 3, 2008 and PCT Written Opinion of the International Searching Authority dated Sep. 3.2008.

* cited by examiner

*Primary Examiner*—Anita K Alanko
(74) *Attorney, Agent, or Firm*—Bose McKinney & Evans LLP

(57) ABSTRACT

A method for removing an undesirable material from an electronic or electrical component and introducing a desirable material in place of the undesirable material. The method can include the replacement of a leaded material found on the component with a no-lead material to meet governmental directives including those of the European Union.

18 Claims, 3 Drawing Sheets

METHOD FOR CONVERTING ELECTRICAL COMPONENTS

FIELD OF THE INVENTION

The present invention relates to a method for removing an undesirable material from an electrical component and introducing a desirable material in place of the undesirable material. More particularly, the present invention relates to a method of replacing a leaded material found on an electrical component with a no-lead material.

BACKGROUND OF THE INVENTION

Product manufacturers incorporate a wide variety of raw materials as well as processed materials in their products. In some instances, these raw and processed materials contain materials which can be considered to be undesirable or hazardous. In an attempt to reduce an individual's exposure to hazardous materials, as well as to reduce the amount of pollutants being introduced in the environment, governments have begun to regulate the use of such materials. In particular, some governments have passed laws to regulate the type and amount of these materials used in the manufacture of products. In addition, some governments have passed laws to regulate the recycling of such materials.

Hazardous or undesirable materials can be found in electrical equipment. For instance, it has been found that electrical equipment can include electrical components containing lead, mercury, cadmium or hexavalent chromium. (As stated herein, electrical components include electronic components as well.) In addition, the enclosures for such equipment can include flame retardant materials, two of which are, polybrominated biphenyls (PBBs) and polybrominated diphenyl ethers (PBDEs). Because such materials can pose environmental risks, the European Union has created a standard, which if met, can reduce the amount of these materials in and on electrical equipment and components. This directive is called the Restriction of the Use of Certain Hazardous Substances in Electrical and Electronic Equipment (RoHS) Directive. While certain exemptions have been provided, for instance, the use of mercury in fluorescent lamps or lead in glass used in cathode ray tubes, products must meet these reduced levels of these materials by Jul. 1, 2006. In addition, it should be noted that PBBs and PBDEs have been exempted, for the time being, by the European Union.

To be RoHS compliant, the amount of lead, mercury, hexavalent chromium, polybrominated biphenyls, and polybrominated diphenyl ethers must be less than one thousand parts per million. For cadmium, the limit is set to less than one hundred parts per million. While this European Union directive only applies to the countries of the European Union, it is presumed that electronic and electrical equipment manufacturers will convert all of their products to meet the RoHS standards, even for those products sold in the United States, since market forces indicate that converting all products to RoHS compliant products can provide more cost effective manufacturing. While the United States has not adopted a similar standard, the state of California has its own so called "California RoHS" standards which are to be effective January, 2007. Japan and China have also adopted standards identical to the RoHS standards to be effective July, 2006.

Currently, a large number of electrical components are manufactured to include the previously stated materials in quantities exceeding the standards set by the European Union. In addition, defective as well as obsolete electrical products are often recycled to reclaim electrical components which are still operational, but which can include these materials. Consequently, both the new and recycled electrical components can include quantities of the previously described materials which exceed the standards set by the European Union.

SUMMARY OF THE INVENTION

The present invention relates to a method for removing an undesirable material from an electrical component and introducing a desirable material in place of the undesirable material. The method includes the steps of preparing the electrical component for removal of the undesirable material, abrading the electrical component to remove the undesirable material, applying an acid to the electrical component to remove the undesirable material, cleaning the component to remove the acid, and applying the desirable material to the electrical component.

In addition, the present invention relates to a method of replacing a leaded material found on an electrical component with a no-lead material. The method includes the steps of applying an acid to the electrical component to remove the leaded material, cleaning the component to remove the acid, and applying the no-lead material to the electrical component.

Another aspect of the present invention includes an electrical component comprising a body, and a plurality of leads each having a no-lead layer, the no-lead layer being formed on each of the plurality of leads after the removal of a leaded layer.

While the described methods are applicable to reducing the amount of undesirable materials, which can be been deemed hazardous, the described processes have also been designed to create RoHS compliancy for electrical components and specifically for the removal of the mercury, lead, hexavalent chromium, and cadmium. After removal of the materials, any lead material which previously had been removed from the leads of an electrical component is replaced with a no-lead solder.

The present invention relates to both the recycling of used components as well as to new components which contain unacceptable levels of the previously described materials. The leads of the electrical component, when the electrical component is a recycled component, is homogenously coated with a leaded flux, and then coated with a heated lead solder. The component is then washed and delivered into a device which applies an abrasive material to remove the leaded solder which has previously been applied to the exposed leads. In addition to removing the lead solder which has been previously applied, any solder which was located on the leads is also removed. This results in substantially all or all of the leaded solder being removed from the exposed leads. After the abrasion step, the component is rinsed in a de-ionized solution and dried.

The remaining steps of the process pertain to all electrical components including new and recycled components. An acid is applied to the leads of the component to remove the plating to thereby expose the copper leads of the component. The component is rinsed in a de-ionized solution to remove the acid and to stop the acid process. The component is then dipped into a no-lead flux and a heated no-lead solder is applied. The device is prepared for delivery to a customer.

Certain segments of the electronics industry whose products can experience high stress environments, such as military and telecommunications, have been fully exempted from complying with the RoHS directives at this time. The described methods can be used on factory new RoHS compliant devices to meet exempted leaded requirements. For instance, the step of dipping a product into a heated no-lead solder can be replaced with dipping a product into a leaded base solder. Concerns related to tin whiskering can be reduced or eliminated and the proper plating necessary for all exempted low temperature soldering requirements can be made.

DETAILED DESCRIPTION OF THE DRAWINGS

Figure 1:
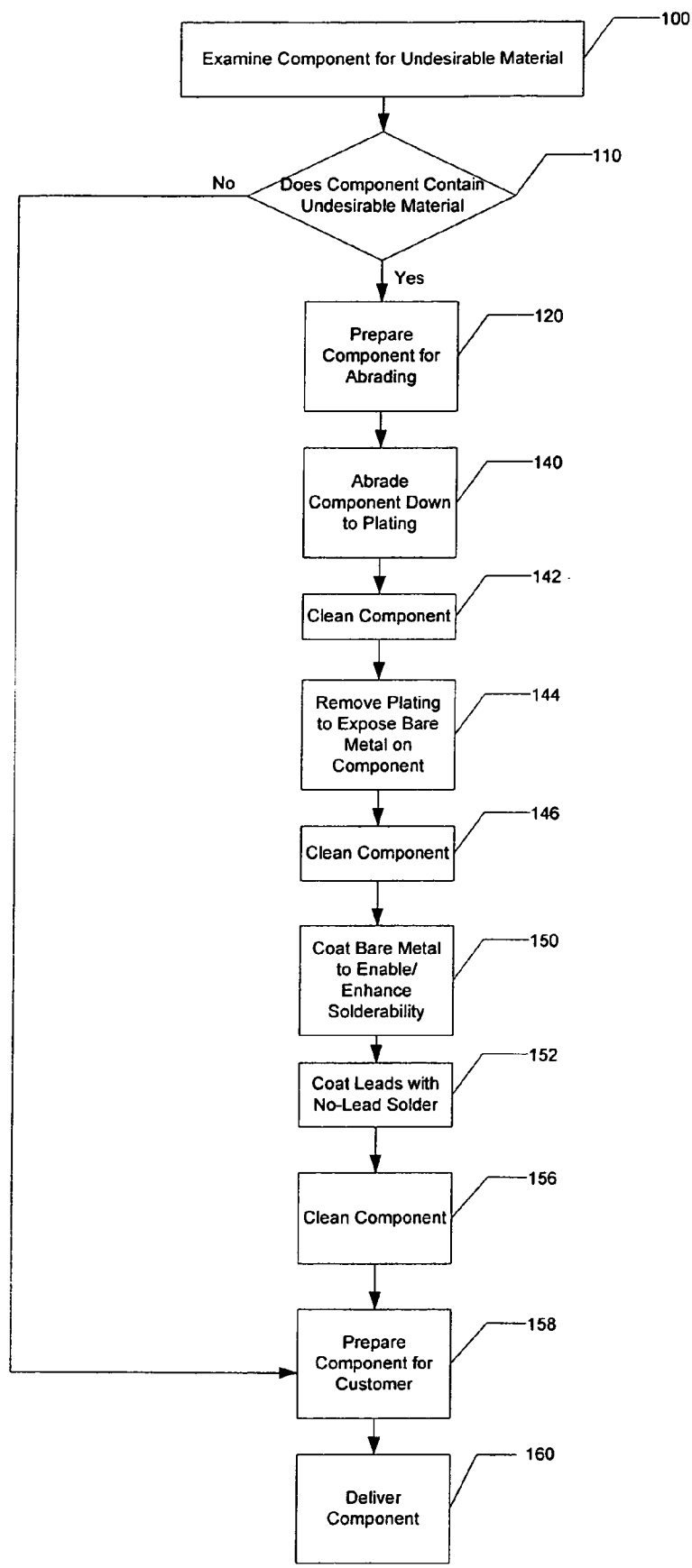
FIG. 1 illustrates a flowchart of a process for the removal of an unwanted or undesirable material from an electrical component and the introduction of a desirable material.

FIG. 1 is a flowchart illustrating one embodiment of the present invention. For a recycled or reclaimed component which has been removed from a printed circuit board for redistribution, the component is examined for an undesirable material at block 100 of FIG. 1. The component is passed through an x-ray device to determine the content of mercury, lead, hexavalent chromium, cadmium, polybrominated biphenyls and polybrominated diphenyl ethers. The x-ray verification at step 100 provides data to establish the presence and amount of the undesirable material(s) found in the recycled components and therefore provides a starting amount which can be used to determine acceptability of the component after the undesirable materials are removed. Some available x-ray devices which can be used are described later herein.

During the examination of the component at block 100, it is determined whether or not the component contains an amount of the undesirable materials. If the component does contain the amount of undesirable materials as determined at block 110, then the process proceeds to block 120. If the component, however, does not contain any of the undesirable materials, then the component is acceptable for preparation to be described later at block 158. If, however, the component does contain one or more undesirable materials, the component is prepared for an abrasion process at block 120. In preparing the component for the abrasion process at block 120, the leaded surface of the leads of the recycled component are prepared such that the leads are given an even and substantially uniform surface such that a later performed abrasion process can be made in an effective manner.

Figure 3A:
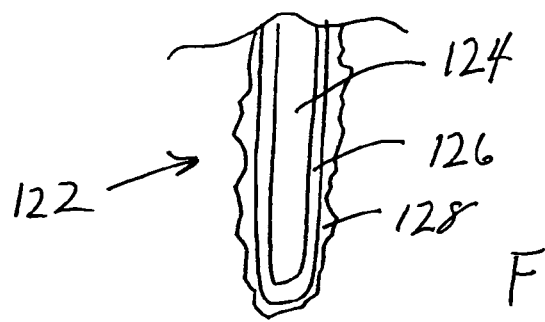
FIG. 3 illustrates a lead of a recycled electrical component to which the process of the present invention has been applied.

For example, a component lead 122 of a recycled electrical component (not shown) can be seen in FIG. 3A. The lead 122 of the recycled component includes a copper lead 124 which has been previously coated with a tin-lead plating 126, during manufacture, and which in turn has been coated with a layer of leaded solder 128, during assembly. As can be seen in FIG. 3A, the solder 128 has a substantially irregular surface resulting from the removal of the electrical component from the printed circuit board. The substantially irregular surface of solder 128 can be prepared prior to the abrasion process to be described later such that an even and substantially uniform surface is formed. While only one lead is shown for purposes of illustration, the present invention includes some, any, or all leads of a component. An electronic component can be include two leads up to 560 leads or more with varying package types including but not limited to TSOP, PLCC, LCC, QFP, SOIC, SOP, DIP, BGA, PGA and other package types as is know by those skilled in the art.

Figure 2:
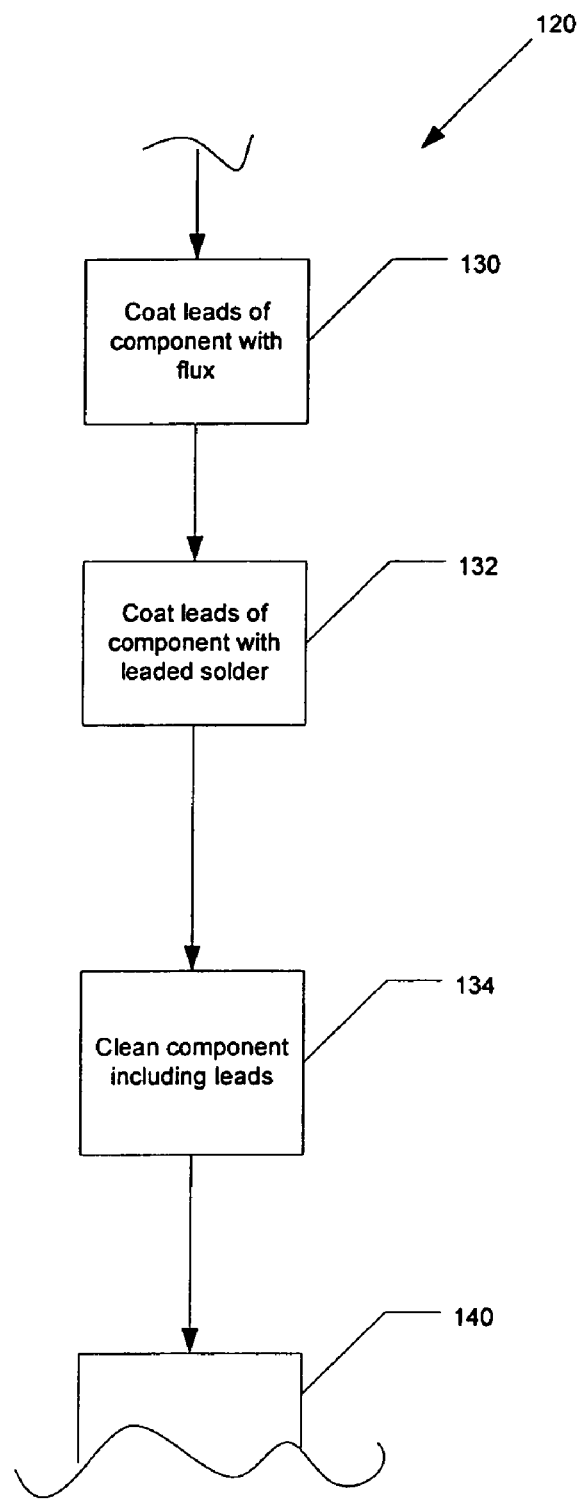
FIG. 2 illustrates a flowchart of additional steps which can comprise the step 120 of FIG. 1.

One embodiment of the step at block 120 of FIG. 1 is further illustrated in FIG. 2. Preparing the component for abrading at block 120 includes a step 130 in which the leads 122 are coated with a leaded flux. The leaded flux prepares the surface of the lead 122 (see FIG. 3A) with an adhering substance which enables the attachment of heated leaded solder to the leaded solder 128 with a substantially uniform coat. By coating leaded solder 128 of the lead 122 with a leaded flux, the presence of bridging, spidering, and other defects can be substantially reduced.

At step 132 of FIG. 2, the leads 122 are coated with a leaded solder. Coating the leads with the solder bath forms a substantially uniform surface to provide better reflow action of the solder layer 128. The leads 122 at step 132 can be dipped into a leaded solder bath which forms an even layer of solder to the exposed leads 122. A homogenous and substantially uniform coating is thereby formed which provides for the results in later steps of the process to be described herein. Other known methods of applying solder are within the scope of the present invention. At step 134, the leads 122 (which have been coated at step 132) and the component as are then cleaned with a de-ionized rinse which removes excess flux from the leads and from the component. The rinse also removes any other added coatings or contaminants which can be present. It is within the scope of the present invention to clean only the leads or the leads of the component in this step as well as other described cleaning steps.

Figure 3B:
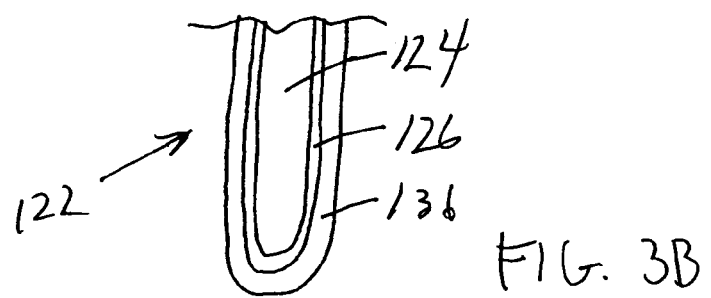
Figure 3C:
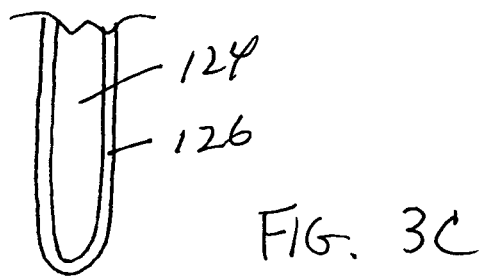

As illustrated in FIG. 3B, the component lead 122 now includes a substantially uniform layer of leaded solder 136 as illustrated. At this point, each of the leads of the component being recycled includes the substantially uniform layer 136 which provides for the results at a later step 140 as illustrated in FIG. 1. At block 140, the component lead 122 is abraded to remove the leaded solder and to expose the plating layer 126. The abrading step 140 can be completed by a microblasting or a soda blasting device which applies a blasting powder to the leaded layer 136 to remove the leaded layer 136 down to the plating surface 126. The abrading step 140 can be made with a device sold by Comco Incorporated of Burbank, Calif. called the Microblaster® Device. It is contemplated that the individual components which have been prepared for abrading at step 120 are delivered to the Microblaster® device where an operator will blast the leaded layer 136 from the component lead 122. As illustrated in FIG. 3C, after the abrasion process, the copper lead 124 and the plating layer 126 remain. Other known methods of removing the leaded layer are within the scope of the present invention. For instance, the use of vapor phase or laser ablation can be used to remove the undesirable layers to expose the copper lead.

After the abrading step 140 has been completed, the component, including leads, is cleaned at block 142. Block 142 can include a de-ionized rinse to remove any additional flux and any remaining leaded particle residue from the component. A non-conductive bath can be used.

At block 144, the plating layer 126, as illustrated in FIG. 3C, is removed to expose a bare metal lead of the component. In one aspect of the present invention, step 144 is completed by applying an acid to the leads of the component to remove the plating layer 126 such that the original bare copper lead is exposed thereby eliminating any lead or other undesirable materials. While it is possible to dip the component leads in an acid bath, other known means of applying an acid to the component leads can be used. The acid should remain on the component lead such that the entire plating layer is removed. If the acid remains on the lead for too long a period of time, however, a significant portion of copper lead 124 can be removed thereby reducing or destroying the usefulness of the part. After step 144, a de-ionized rinse is applied to the component leads at block 144 to stop the acid from continuing to dissolve or corrode the lead. A de-ionized rinse is used to remove any of the remaining acid as well as to remove any excess flux from the component. Any of the remaining lead or other particle residue at block 146 is also substantially removed.

Figure 3D:
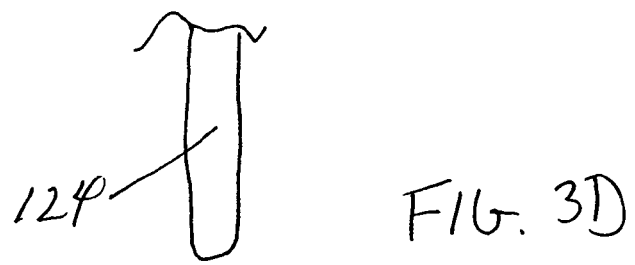

As can be seen in FIG. 3D, the copper lead 124 is substantially or completely exposed after block 146 with minimal or no remaining plating or leaded solder.

It should be noted that the step 144 is the first step which applies to both recycled and to new components to reduce the amount of undesirable materials present. For instance, the first step for a new component which includes lead is described at step 144 to remove the plating layer. Such components need not be examined at step 100 since the content of undesirable materials in a new component is often known. Steps 110, 120, and 140 typically apply to recycled components. At step 146, the component is cleaned with the application of a de-ionized solution and then dried. After step 146 the recycled components as well as the new components now have the undesirable materials removed.

At step 150, the bare metal lead (typically copper) is coated to enable or to enhance solderability. In this step, a no-lead flux is applied to the bare metal lead which enables a no-lead solder to adhere to the newly exposed metal leads or to the newly exposed copper leads in an even and consistent manner. Because no-lead solders have a higher temperature rating than leaded solders, the metal lead is prepared with a no-lead flux so that the no-lead solder can adhere more readily to the prepared metal lead. In addition to providing an electrical component lead which can more readily accept a no-lead solder, the use of a no-lead flux also provides a cleaner work environment for employees and can enhance the environment due to the minimized level or absence of undesirable or hazardous materials. Appropriate fluxes include no clean flux, organic flux, lead free flux, and organic acid flux.

Figure 3E:
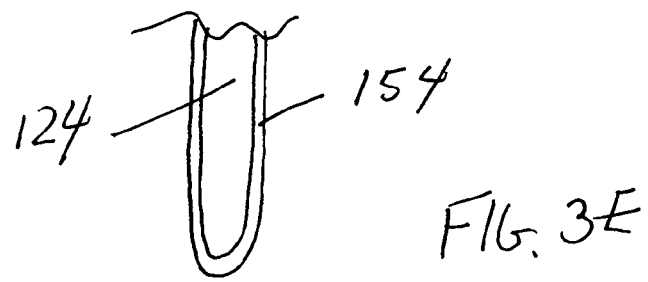

At step 152 of FIG. 1, the leads are coated with a no-lead solder. In one embodiment, the leads are dipped in a no-lead solder bath, which can include a silver tin copper no-lead solder, to enable an even coating of newly organic no-lead solder which thereby permits the proper temperature solderability for use in no-lead manufacturing. As illustrated in FIG. 3E, this applying step has coated the copper lead 124 with a no-lead solder layer 154. Appropriate no-lead solders include tin-silver, tin-copper, tin-silver-nickel, tin-silver-copper, tin-silver-antimony, tin-silver-copper-nickel, nickel-palladium-copper, and silver-copper-nickel. It is also within the scope of the present invention to plate each of the leads with a no-lead plating as would be understood by one skilled in the art.

At step 156, the component can be cleaned in a de-ionized rinse to remove any excess flux from the component as well as any other materials which might be removed by the rinse. At step 158, the component is prepared for the customer. This step can include a number of items, some of which can be specifically requested by a customer. For instance, the preparation step 158 can include passing the component through a quality control process to determine the polarity of certain components for correct lead positioning as well as visual inspections for solder defects. The component can be passed through an x-ray device to verify, certify, and to document the fact that the process has been effective in reducing the undesirable materials to less than an established limit, including those the RoHS standards proposed by the European Union and previously stated herein. In addition, the parts can be marked, for instance with a laser imprint, to signify that the parts have been processed and are verified to be within the range of the acceptable limits. Packaging can also be performed. After step 158 has been completed, the component can be delivered to the customer at step 160.

As described herein, an electrical component made according the described process includes a body and a plurality of leads each having a no-lead layer, wherein the no-lead layer is formed on each of the plurality of leads after the removal of the leaded layer. The removal of the leaded layer is followed by the application of a no-lead flux. The no-lead flux provides for the application of a no-lead layer. The electrical components which can be made according to the described process include a resistor, a capacitor, an inductor, and an integrated circuit/semi-conductor device or computer chip. It is within the scope of the present invention to form other types of electrical component including the removal of an undesirable material and the application of a desired material.

Testing of a component before and after being processed reduced the amount of undesirable materials. One tested component (using destructive (ICP-MS) test results) originally containing lead in the amount of 1780 ppm, which is above the limit for lead established by the RoHS standards, was reduced to 428 ppm after being processed. In addition, this same component which was originally tested to include 3330 ppm of bromide included less than 326 ppm of bromide after being processed. It is noted that the testing process for bromine converts the sample of bromine into bromide. The amount of bromide provides an indication of bromine since the found concentration of any brominated compounds can not exceed the level of bromine in a sample. Consequently, the described process reduced the levels of lead and bromine to acceptable levels. The levels of the other remaining materials were originally determined to be at low levels. After testing, it was found that these levels did not increase and remained at or below the previously tested low levels.

These results were also confirmed with x-ray fluorescence (XRF) testing made with a NITON XLt 700 Series Analyzer available from NITON LLC 900 Middlesex Turnpike, Billerica, Mass., and with an Innov-X Systems analyzer available from Innov-X Systems, Inc., Woburn, Mass. In addition results were confirmed by x-ray spectrometry testing made with a Fischerscope X-Ray XDAL device available from Fischer Technology Inc., Windsor Conn.

Acids which can be used at block 144 of FIG. 1 include stripping agents such as Alstrip 98LC and Alstrip 2000 which are commercially available from Schloetter Company Limited, Worcestershire, UK.

It is also within the scope of the present invention to designate the undesirable material as a no-lead material and to replace the no-lead material with a leaded material. For instance, military equipment can require the use of leaded solder in its equipment due to the harsh environments such equipment can be subjected to. The present invention can therefore include an electrical component including a plurality of leads having a leaded layer, wherein the leaded layer is formed on each of the plurality of leads after the removal of a no-leaded layer.

Although the invention has been described in detail with reference to certain illustrated embodiments, variations and modifications exist within the scope and spirit of the present invention as defined in the following claims.

What is claimed is:

1. A method for removing an undesirable material from an electrical component and introducing a desirable material to the component, wherein the undesirable material includes a leaded solder overlaying a plating layer and is disposed on a lead projecting from the electrical component, said method comprising the steps of:

preparing the electrical component for removal of the undesirable material;

abrading the electrical component to remove the leaded solder;

applying an acid to the electrical component to remove the plating layer;

cleaning the component to remove the acid; and applying the desirable material to the electrical component.

2. The method of claim 1, further comprising examining the electrical component for the presence of the undesirable material.

3. The method of claim 2, wherein the examining step is performed prior to the preparing step.

4. The method of claim 3, further comprising examining the electrical component for the presence of the undesirable material after the first applying step.

5. The method of claim 2, wherein the examining step is performed after the first applying step.

6. The method of claim 1, the preparing step further comprising the step of coating the undesirable material with a first material to facilitate the application of a second material.

7. The method of claim 6, the preparing step further comprising the step of coating the first material with the second material.

8. The method of claim 6, wherein the first material comprises a leaded flux.

9. The method of claim 6, wherein the second material comprises a leaded solder.

10. The method of claim 7, the abrading step further comprising the step of using an abrasive material to remove the second material from the electrical component.

11. The method of claim 1, wherein the step of preparing the electrical component comprises non-abrasively forming a uniform surface on the undesirable material.

12. The method of claim 11, wherein a uniform surface is formed on the undesirable material by applying a leaded solder to the undesirable material.

13. The method of claim 11, wherein the step of abrading the electrical component removes both the applied leaded solder and the leaded solder forming a part of the undesirable material.

14. The method of claim 1, the first applying step further comprising applying the acid to the electrical component to remove the plating layer from the electrical component to expose bare metal.

15. The method of claim 14, the second applying step further comprising the step of applying the desirable material to the bare metal.

16. The method of claim 15, wherein the desirable metal is a no-lead solder.

17. The method of claim 16, the cleaning step further comprising rinsing the acid from the electrical component and drying the electrical component.

18. The method of claim 17, further comprising the step of rinsing and drying the electrical component after the abrading step.

* * * * *